United States Patent [19]

Kamon

[11] Patent Number: 5,538,818

[45] Date of Patent: Jul. 23, 1996

[54] REFLECTION PHOTOMASK

[75] Inventor: Kazuya Kamon, Itami, Japan

[73] Assignee: Mitsubishi Denki Kabushiki Kaisha, Tokyo, Japan

[21] Appl. No.: 343,953

[22] Filed: Nov. 17, 1994

Related U.S. Application Data

[62] Division of Ser. No. 67,953, May 27, 1993, Pat. No. 5,393,623.

[30] Foreign Application Priority Data

May 28, 1992 [JP] Japan .................................. 4-136991

[51] Int. Cl.⁶ ...................................................... G03F 9/00
[52] U.S. Cl. .................. 430/5; 430/321; 430/322; 430/396
[58] Field of Search ............................... 430/5, 321, 275, 430/322, 396; 427/164, 165

[56] References Cited

U.S. PATENT DOCUMENTS

| | | | |
|---|---|---|---|
| 5,279,911 | 1/1994 | Kamon et al. | 430/5 |
| 5,328,784 | 7/1994 | Fukuda | 430/5 |
| 5,338,647 | 8/1994 | Nakagawa et al. | 430/5 |

*Primary Examiner*—S. Rosasco
*Attorney, Agent, or Firm*—Leydig, Voit & Mayer

[57] ABSTRACT

A reflection photomask includes a substrate having a surface; and a first reflection circuit pattern and a second reflection circuit pattern on the surface of the substrate so that light reflected from the first reflection circuit pattern is different in phase from light reflected from the second reflection circuit pattern.

11 Claims, 14 Drawing Sheets

REFLECTION PHOTOMASK

This disclosure is a division of application Ser. No. 08/067,953, filed May 27, 1993, U.S. Pat. No. 5,393,623.

BACKGROUND OF THE INVENTION

1. Field of the Invention

The present invention relates to a reflection photomask and an exposure apparatus suitable for use in the production of large scale integrated circuits (LSIs).

2. Description of the Related Art

An optical system of a projection exposure apparatus according to the related art is shown in FIG. 12. A mirror 2 is provided between a lamp house 1 and a fly-eye lens 3. Sequentially arranged following order in the downstream in the light path from the fly eye lens 3 are: an aperture member 4; relay lenses 5A; a stop 6 between the relay lenses 5A; another mirror 7; a condenser lens 5B; and a photomask 8 having a circuit pattern. Projection lenses 9A and 9B are arranged in that order downstream from the photomask 8. A wafer 10 is placed in front of (downstream from) the projection lens 9B.

When the light emitted from the lamp house 1 is reflected by the mirror 2 and then reaches the fly-eye lens 3, the light is divided into bundles by component lenses 3a of the fly-eye lens 3. The light bundle transmitted through each of the component lenses 3a further travels via an aperture 4a of the aperture member 4, the relay lenses 5A, the stop 6, the mirror 7 and the condenser lens 5B so as to fall on the entire surface of the photomask 8. The light bundles from the component lenses 3a of the fly-eye lens 3 overlap one another on the photomask 8, thus achieving uniform illumination over the entire surface of the photomask 8. The light transmitted through the photomask 8 travels through the projection lenses 9A and 9B to strike the wafer 10. In this manner, a photoresist film provided beforehand on the surface of wafer 10 is exposed to the illumination light, thus preparing a circuit pattern.

An example of a conventionally-used photomask 8 is shown in FIG. 13. The example photomask 8 comprises: a transparent substrate 11 made of glass or the like; metallic light-blocking films 12 formed on the transparent base board 11, the light blocking films 12 forming a repetitive pattern; and phase shift members 13 selectively provided in light transmitting portions, that is, the portions not covered by the light blocking films 12. The light entering the transparent substrate 11 is varied in intensity by the light transmitting portions and the light blocking portions covered by the light blocking films 12. Further, the phase of the light transmitted through the portions covered by the phase shift members 13 is shifted by a predetermined difference from the phase of the light transmitted through other portions. The imaging characteristic is thus enhanced.

The above-described photomask 8 is produced by the steps as shown in FIGS. 14A to 14D. First, an etching stopper 14 and a light blocking film 12 are sequentially vapor-deposited on a transparent substrate 11, as shown in FIG. 14A. After the light blocking film 12 is selectively etched to form a light blocking pattern as shown in FIG. 14B, spin on glass (SOG), a material for phase shift members 13, is applied to both the etching stopper 14 and the light blocking film 12 to form a SOG film 15 as shown in FIG. 14C. Finally, the SOG film 15 is selectively etched to form phase shift members 13 as shown in FIG. 14D.

Various constructions of photomasks have been proposed. For example, a photomask shown in FIG. 15A has phase shift members 13 arranged in every other light transmitting portion of the repetitive pattern so that the light bundles transmitted through two neighboring light transmitting portions weaken each other.

A photomask shown in FIG. 15B has small auxiliary phase shifters 16 formed of SOG or the like on the peripheries of the isolated patterns. Because the auxiliary phase shifters 13 are so small that the images thereof will not be resolved, the light diffracted from the auxiliary phase shifters 13 enhances the optical image of the main pattern.

A photomask shown in FIG. 15C has phase shift members 13 on the peripheries of the openings of isolated patterns and, thereby, peripheral portions of the optical image of the main pattern are eliminated, thus enhancing the optical image.

A photomask shown in FIG. 15D has phase shift members 13 and thin light-blocking films 12 having a reduced thickness so as to achieve a half tone quality (semitransparency). The combination of the phase shift members 13 and the thin light-blocking films 12 reverses the phase of the light transmitted therethrough and, thereby, peripheral portions of the optical image of the main pattern are eliminated, thus enhancing the optical image.

Further, a photomask shown in FIG. 16A has a multi-layer phase shift member 13 having a $\pi/2$ phase shift portion 17 in a boundary between the 0 phase region and the $\pi$ phase region, thus increasing the degree of freedom in pattern layout.

A photomask shown in FIG. 16B forms light blocking portions by utilizing interference between the light phase-reversed by the phase shift members 13 and the light transmitted though portions not covered by the phase shift members 13. This photomask achieves a higher light blocking effect than other photomasks having metallic light-blocking patterns.

A photomask shown in FIG. 16C has metallic light blocking films provided in the phase shift members 13, thereby increasing the degree of freedom in pattern size.

A photomask shown in FIG. 16D forms a light blocking pattern by utilizing edge portions of relatively large phase shift members 13.

A photomask shown in FIG. 16E has such small phase shift members 13 that their images are not resolved, thus achieving a light blocking pattern having a large area without using a metallic film.

Thus, the conventional photomasks have phase shift members 13 or auxiliary phase shifters 16 formed by patterning SOG films. However, when electron beam exposure is performed, the phase shift members or auxiliary phase shifters 16 are electrically charged, thus distorting the course of electron beams. Therefore, a correction in accordance with the patterns is required.

SUMMARY OF THE INVENTION

Accordingly, an object of the present invention is to provide a reflection photomask eliminating distortion in the course of electron beams caused by electric charges.

Another object of the present invention is to provide an exposure apparatus employing the reflection photomask.

To achieve the above objects, according to one aspect of the present invention, there is provided a reflection photomask comprising a substrate, and first and second reflection circuit patterns on a surface of the substrate for reflecting light bundles differing in phase.

According to another aspect of the present invention, there is provided an exposure apparatus comprising: a light source; a reflection photomask having a circuit pattern; a Koehler illumination optical system for irradiating the reflection photomask with the illumination light emitted from the light source; and a projection optical system for projecting the image of the circuit pattern by converging the light reflected from the photomask onto a substrate for exposure.

DESCRIPTION OF THE PREFERRED EMBODIMENTS

The preferred embodiments of the present invention will be described hereinafter with reference to the attached drawings.

Figure 1:
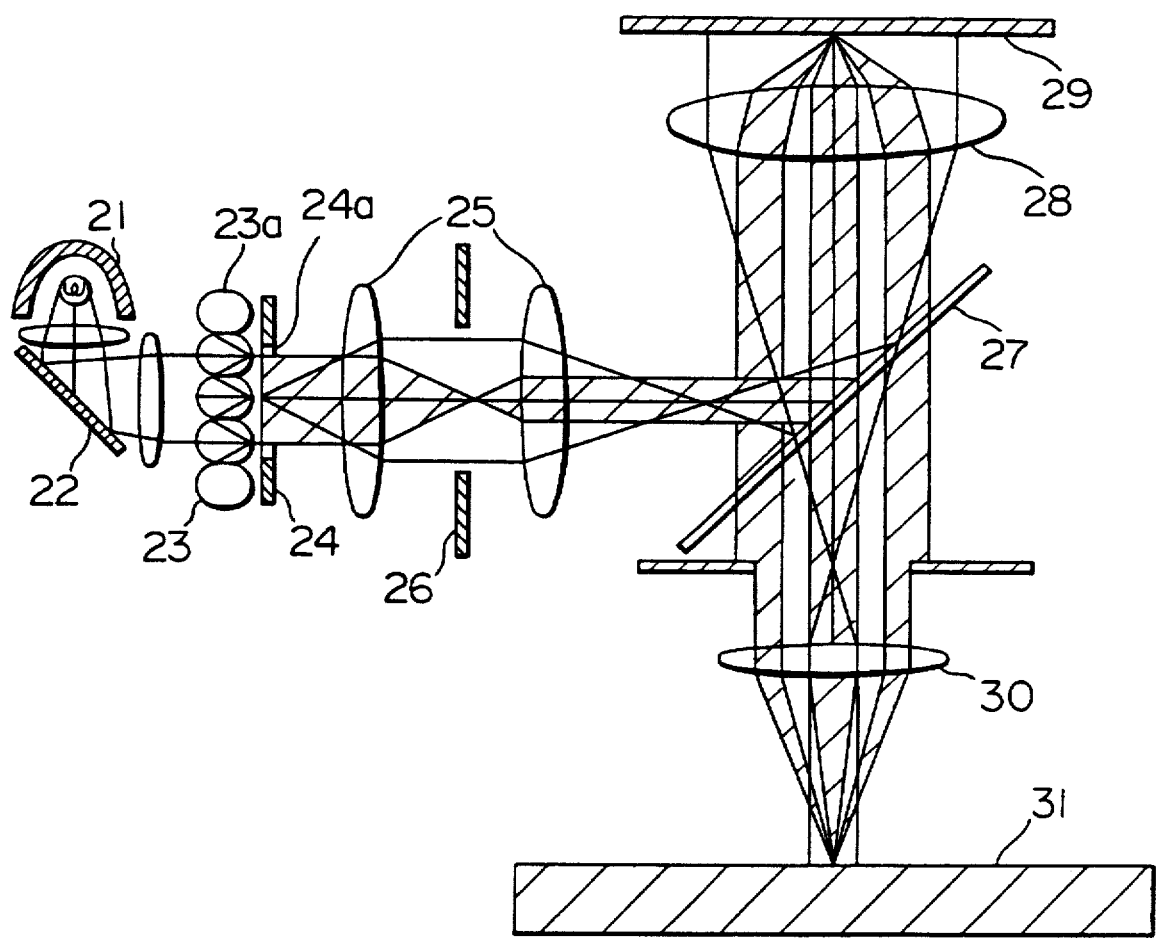
FIG. 1 illustrates an optical system of an exposure apparatus according to one embodiment of the present invention.

Referring to FIG. 1, a mirror 22 is provided in front of a lamp house 21 which is a light source. A fly-eye lens 23 is provided in the downstream light path from the mirror 22. Sequentially arranged following order in the downstream from the fly-eye lens 23 are: an aperture member 24; relay lenses 25; a stop 26 provided between the relay lenses 25; and a half mirror 27. Provided on one side of the half mirror 27 is a lens 28, above which is placed a reflection photomask 29 having a circuit pattern. A projection lens 30 is provided on the side of the half mirror 27. A wafer 31 is placed on the opposite side of the projection lens 30 from the half mirror 27.

The fly-eye lens 23, the aperture member 24, the relay lenses 25, the stop 26, the half mirror 27 and the lens 28 constitute a Koehler illumination optical system. The projection lens 30 is part of an optical projection system. Because the reflection photomask 29 is employed, the lens 28 could be considered a member of both the Koehler illumination optical system and the optical projection system, thus reducing the size of the exposure apparatus.

The operation of the exposure apparatus will be described hereinafter. When the light emitted from the lamp house 21 is reflected by the mirror 22 and then reaches the fly-eye lens 23, the light is divided into light bundles by component lenses 23a of the fly-eye lens 23. The light bundle transmitted through each of the component lenses 23a travels via an aperture 24a of the aperture member 24, the relay lenses 25 and the stop 26 so as to fall on the half mirror 27. The light reflected from the half mirror 27 is transmitted through the lens 28 to fall on the entire surface of the reflection photomask 29. Although FIG. 1 only shows that the light bundle transmitted through a component lens 23a which is provided at a center portion of the fly-eye lens 23 falls on the entire surface of the reflection photomask 29, the light bundles transmitted through the other component lenses 23a also fall on the entire surface of the reflection photomask 29. In other words, the light bundles from the component lenses 23a of the fly-eye lens 23 overlap one another on the reflection photomask 29, thus achieving uniform illumination over the entire surface of the reflection photomask 29.

The light reflected from the reflection photomask 29 is transmitted through the lens 28 and the half mirror 27, and then transmitted through the projection lens 30 to strike the wafer 31. In this manner, a photoresist film on the surface of wafer 31 is exposed to the illumination light, thus forming a circuit pattern.

Figure 2:
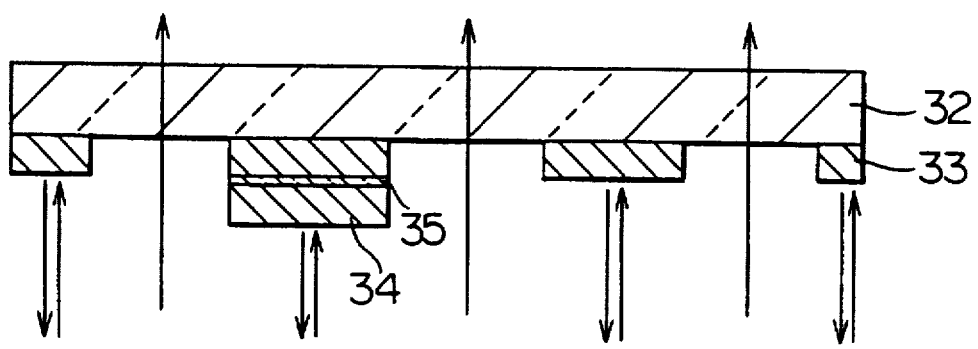
FIG. 2 is a sectional view of a reflection photomask according to the present invention.

The structure of the reflection photomask 29 will be described with reference to FIG. 2. The reflection photomask 29 comprises: a glass substrate 32; first reflection aluminium films 33 on the glass substrate 32 having a predetermined pattern; and second reflection aluminium films 34 which are selectively provided on etching stoppers 35 provided on some of the first reflection films 33. The elevation of the surfaces of the first reflection film 33 is different from the elevation of the surfaces of the second reflection films 34.

The light striking the bottom surface of the reflection photomask 29 is varied in intensity by the first and second reflection films 33 and 34, and the light bundles reflected from the first and second reflection films 33 and 34 vary in phase from each other due to the different elevations of the surfaces thereof. Thereby, the imaging characteristic of the reflection photomask 29 is enhanced. In other words, a reflection phase shift mask is achieved.

Figure 3A:
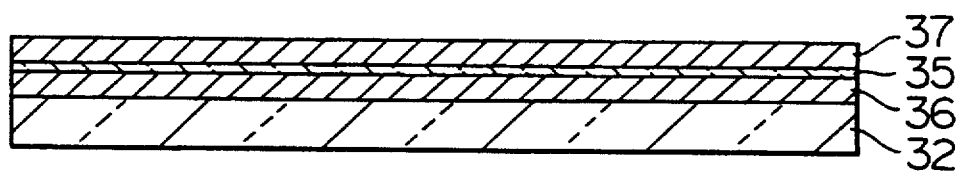
FIGS. 3A to 3C illustrate steps for producing the photomask shown in FIG. 2.
Figure 3B:
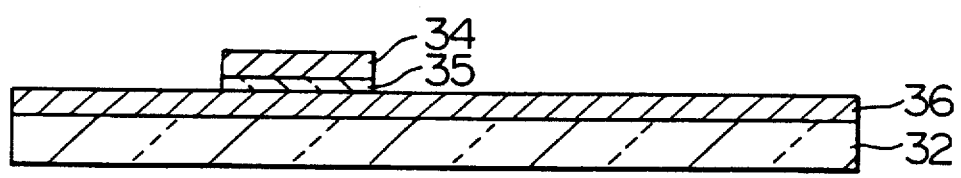
Figure 3C:
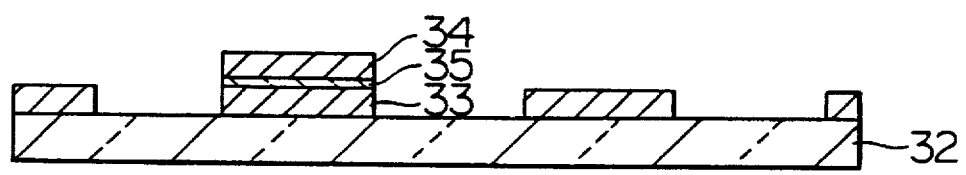

The reflection photomask 29 as described above is produced by the following steps. First, as shown in FIG. 3A, a first aluminium film 36, an etching stopper 35 and a second aluminium film 37 are sequentially vapor-deposited on a surface of a glass substrate 32. Examples of the material of the etching stopper 35 are SOG and $Si_3N_4$. After the second aluminium film 37 is selectively etched to form second reflection films 34 as shown in FIG. 3B, the thus-exposed portions of the first aluminium film 36 are selectively etched to form first reflection films 33 as shown in FIG. 3C.

Figure 13:
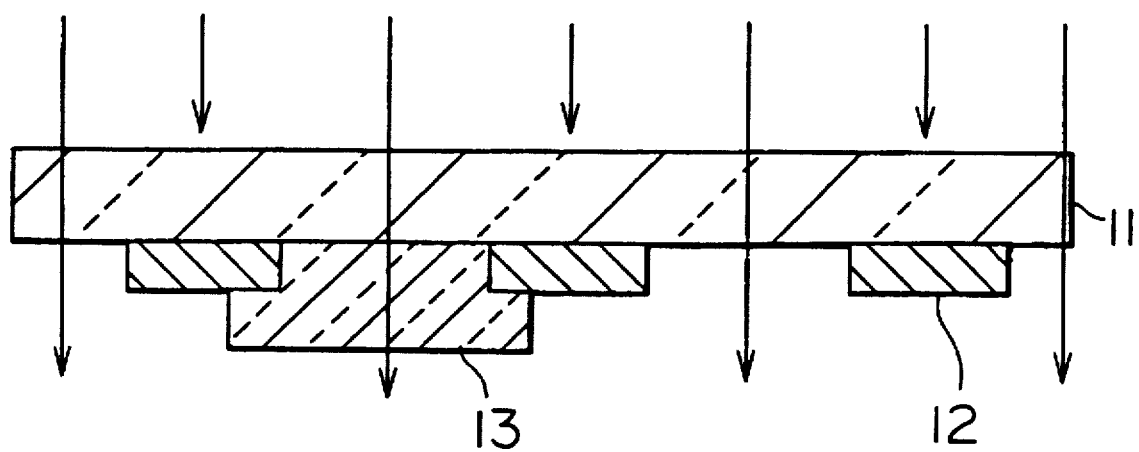
FIG. 13 is a sectional view of a conventional transmission photomask.
Figure 14A:
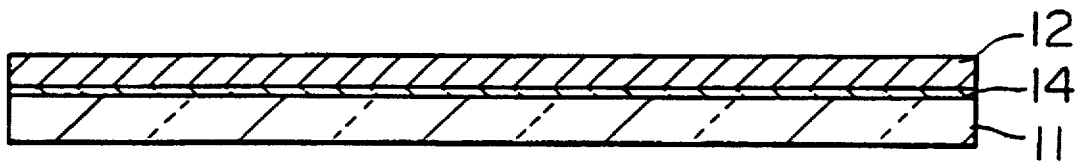
FIGS. 14A to 14D illustrate steps for producing the photomask shown in FIG. 13.
Figure 14B:
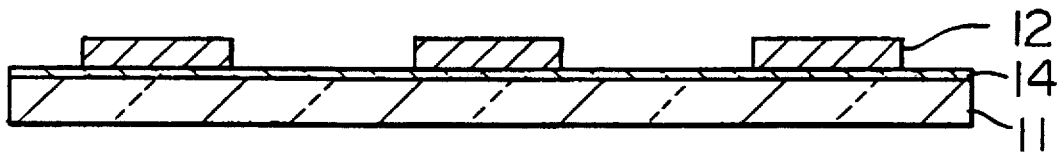
Figure 14C:
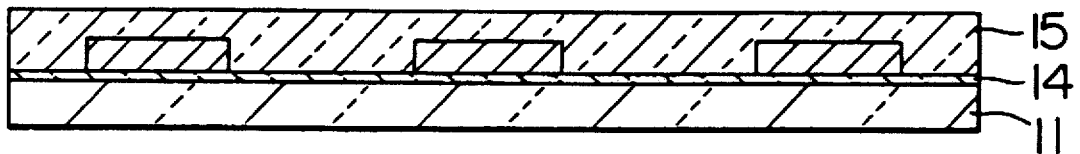
Figure 14D:
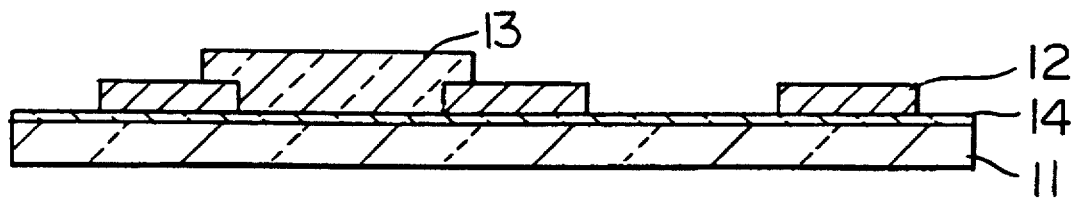
Figure 15A:
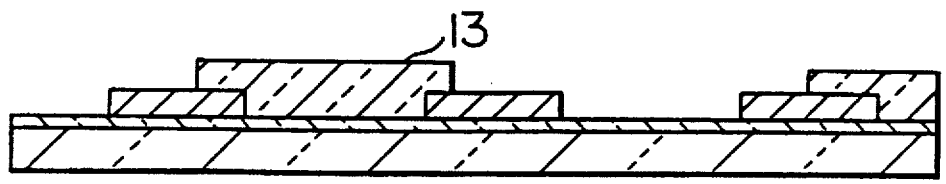
FIGS. 15A to 15D and 16A to 16E are sectional views of various photomasks according to the conventional art.
Figure 15B:
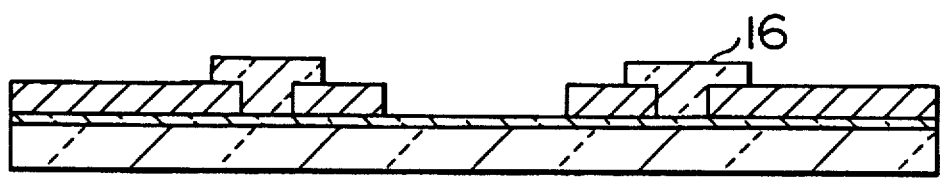
Figure 15C:
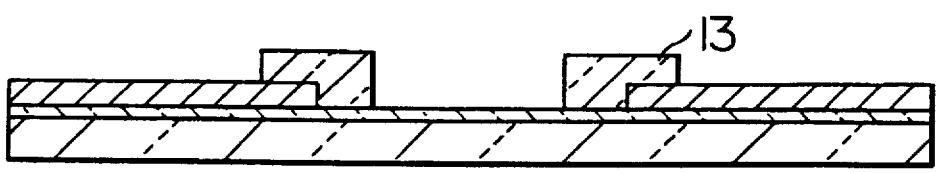
Figure 15D:
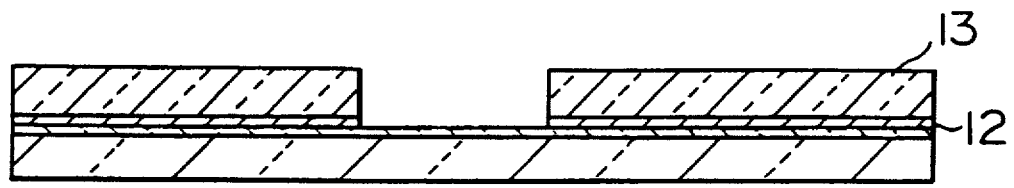
Figure 16A:
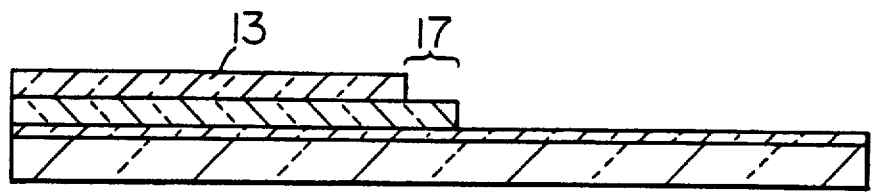
Figure 16B:
Figure 16C:
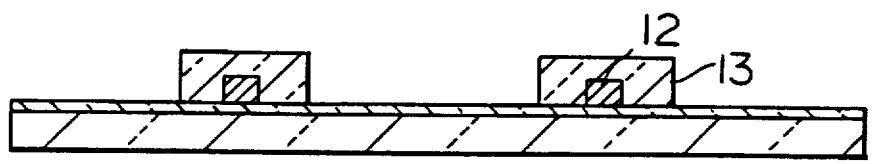
Figure 16D:
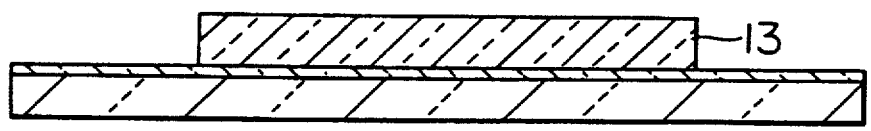
Figure 16E:
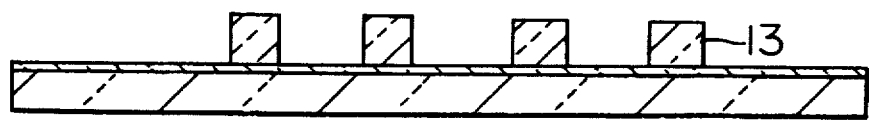

Unlike the conventional transmission photomask 8 shown in FIG. 13, the reflection photomask 29 does not have a transparent phase shift member. Because a phase shift member is usually formed of SOG which is similar to the glass used for the substrate, the etching select ratio that can be employed to etch the SOG film on the glass substrate is limited to a relatively narrow range, thus impeding high-precision etching. On the other hand, because the reflection photomask 29 according to the present invention does not have such a phase shift member, high-precision patterning can be relatively easily performed. Further, according to the conventional art, a phase shift member made of an insulating material gives rise to a problem in that the phase shift member is electrically charged during electron beam exposure and therefore distorts the course of the electron beams. The reflection photomask 29 according to the present invention is free from such a problem, thus facilitating high-precision pattern exposure.

Various reflection photomasks that can be produced by a method as described above will be described below.

Figure 4A:
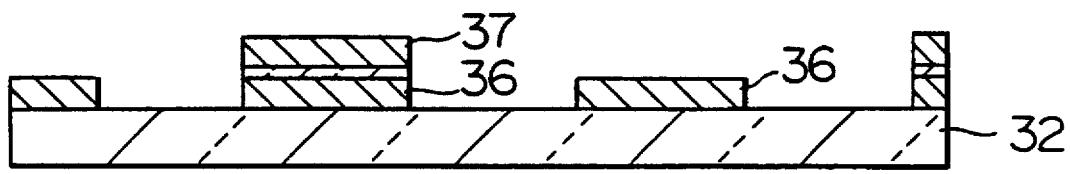
FIGS. 4A to 4D and 5A to 5E are sectional views of other reflection photomasks according to the present invention.

A reflection photomask shown in FIG. 4A has first aluminum films 36 forming repetitive reflection patterns and second aluminium films 37 on every other first aluminium film 36. Because the light bundles reflected from the first aluminium films 36 and the light bundles reflected from the second aluminium films 37 are out of phase, that is, they have a phase difference, the light bundles reflected from two neighboring reflection portions destructively interfere with each other, that is, weaken each other.

Figure 4B:
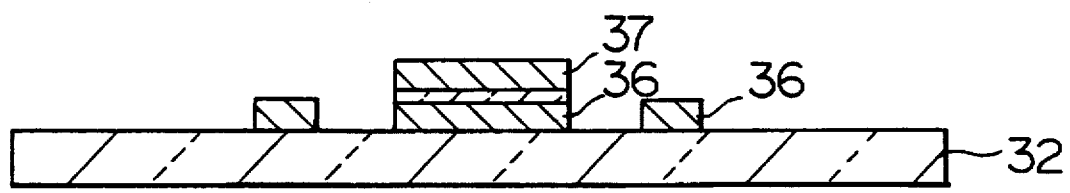

A reflection photomask shown in FIG. 4B has an isolated reflection pattern formed of a first aluminium film 36 and a second aluminium film 37 and auxiliary reflection films each formed of a first aluminium film 36. The auxiliary reflection films are spaced apart from the periphery of the isolated reflection pattern, and they are so small that the images thereof will not be resolved. The light diffracted by the auxiliary reflection films enhances the optical image of the isolated reflection pattern.

Figure 4C:
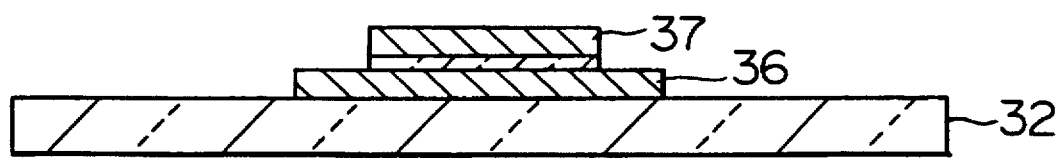

A reflection photomask shown in FIG. 4C has a first aluminium film 36 and a second aluminium film 37 on the first aluminium film 36 so as to form an isolated reflection pattern. The first aluminium film 36 is larger than the second aluminium film 37 so that a portion of the first aluminium film 36 having a predetermined width is exposed. The light reflected from the exposed portion of the first aluminium film 36 substantially eliminates a peripheral portion of the optical image of the isolated reflection pattern, thus enhancing the optical image thereof.

Figure 4D:
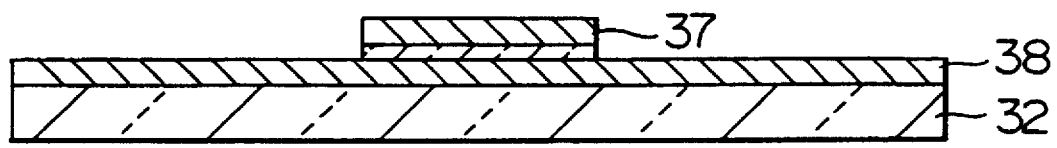

A reflection photomask shown in FIG. 4D has a chromium film 38 on the entire surface of the glass substrate 32 and an aluminium film 37 provided on the chromium film 38 in an isolated reflection pattern. Since chromium has a lower reflectivity than aluminium, the chromium film 38 achieves a half-tone reflection film. The light bundles reflected from the aluminium film 37 and the chromium film 38 vary in phase in accordance with the elevations of the surfaces the two films. The thus-achieved phase difference eliminates a peripheral portion of the optical image of the isolated reflection pattern, thus enhancing the optical image thereof.

Figure 5A:
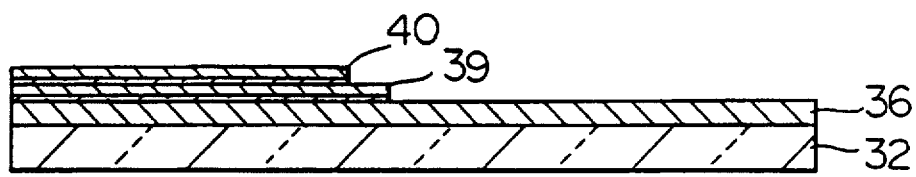

A reflection photomask shown in FIG. 5A has first, second and third aluminium films 36, 39 and 40 laminated on the glass substrate 32. The light bundles reflected respectively from the first, second and third aluminum films 36, 39 and 40 vary in phase in accordance with the elevations of the surfaces of these films. More specifically, the light bundle reflected from a portion of the third aluminum film 39 exposed between the first pattern formed by the first aluminum film 36 and the second pattern formed by the second aluminium film 40 has an intermediate phase between the phases of the light bundles reflected from the first and second patterns.

Figure 6:
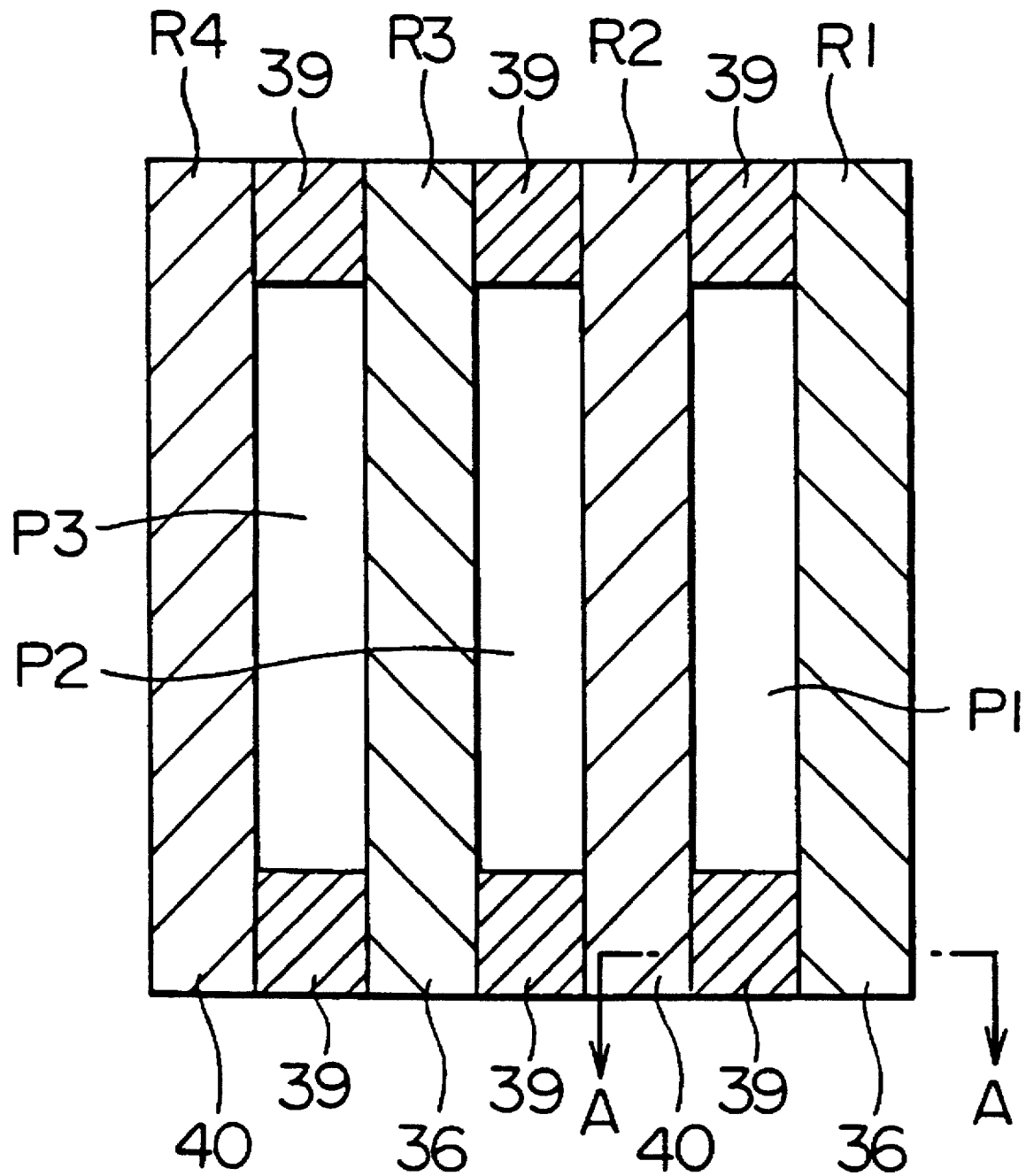
FIG. 6 is a plan view of the photomask shown in FIG. 5A.
Figure 7A:
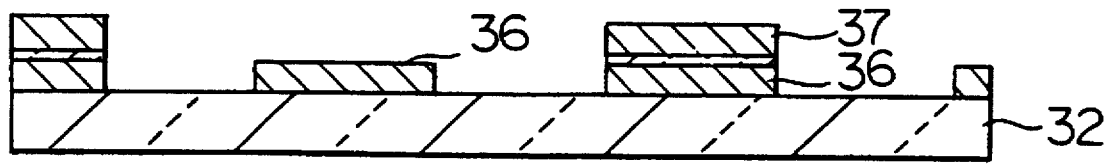
FIGS. 7A to 7D and 8A to 8E are sectional views of reflection photomasks having phases reversed from those of the corresponding reflection photomasks shown in FIG. 4A to 4D and 5A to 5E.
Figure 7B:
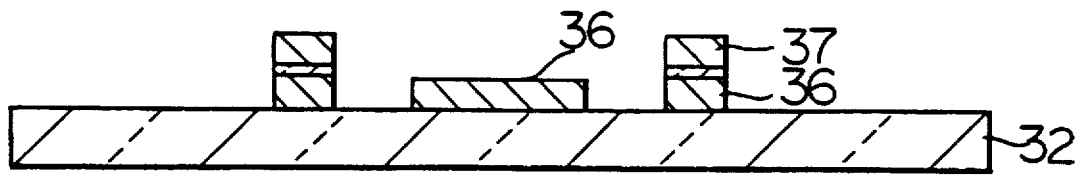
Figure 7C:
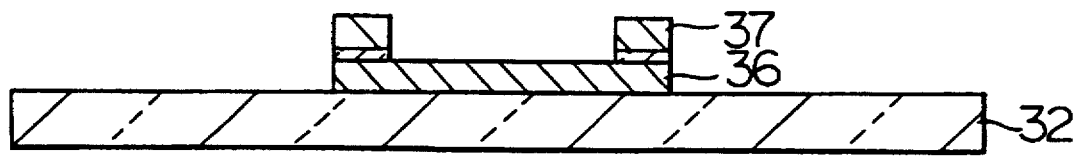
Figure 7D:
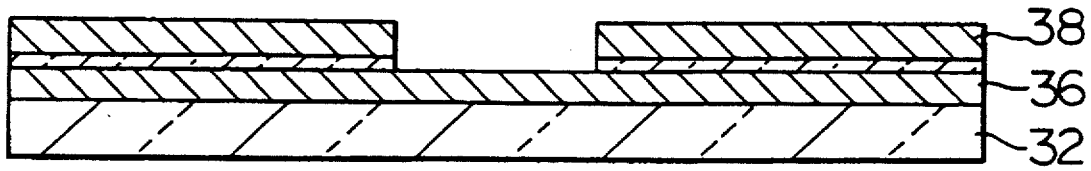
Figure 8A:
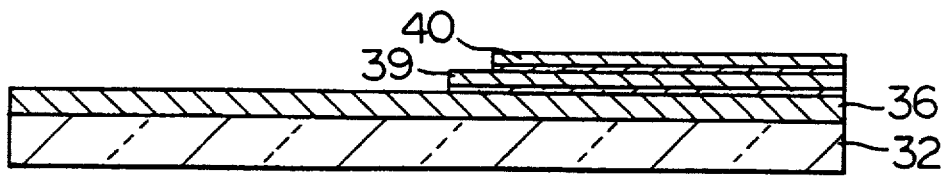
Figure 8B:
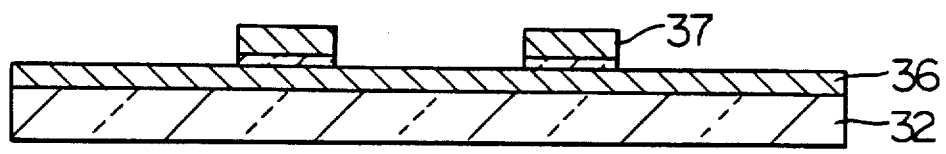
Figure 8C:
Figure 8D:
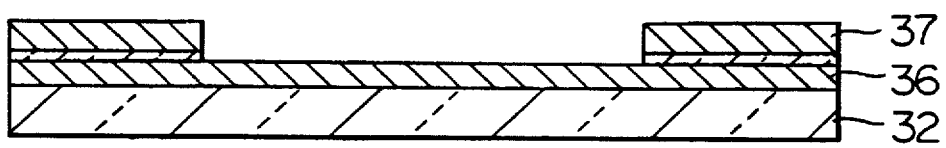
Figure 8E:
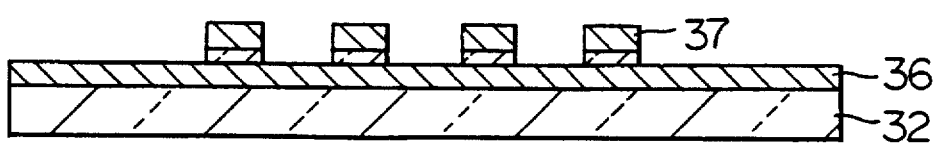

If a repetitive pattern is composed of rectangular dark portions P1 to P3 and reflection portions R1 to R4 as shown in FIG. 6, the light bundles reflected from two neighboring reflection portions should preferably be exactly out of phase (that is, the phases thereof being opposite to each other) in order to achieve a maximum enhancement of the imaging characteristic. More specifically, if the phase angles of the light bundles reflected from the reflection portions R1 and R3 are 0, the phase angles of the light bundles reflected from the reflection portions R2 and R4 are π. However, if two neighboring reflection portions are directly connected at the shorter sides of the dark portion provided therebetween, the reflected light bundles having a phase difference π interfere with each other so as to form a dark area; in other words, the connected portions act as light blocking portions. To avoid formation of the dark area, reflection films 39 of an intermediate phase angle of π/2 are provided to connect two neighboring reflection portions. Freedom in pattern layout is thus increased. FIG. 5A is a sectional view taken on line A—A of FIG. 6.

Figure 5B:
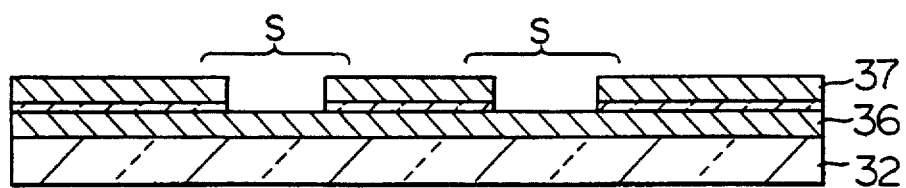

A reflection photomask shown in FIG. 5B has a first aluminum film 36 on the glass substrate 32 and second aluminium films 37 on the first aluminium film 36 so as to have a predetermined pattern. The light bundles reflected from the first and second aluminium films 36 and 37 are exactly out of phase due to the different elevations of the surfaces of the first and second aluminum films 36 and 37. Because of the interference between these light bundles, light blocking portions S are achieved at the peripheries of the predetermined pattern. These light blocking portions S achieve a very strong light-blocking effect.

Figure 5C:
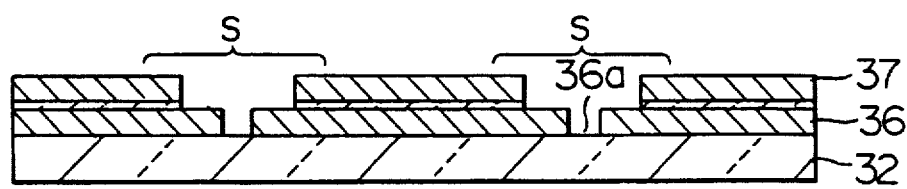

A reflection photomask shown in FIG. 5C is similar to the reflection photomask shown in FIG. 5B, but further comprises gap portions 36a in the first aluminium film 36, thus increasing the area of the light blocking portion S. Freedom in pattern layout is increased.

Figure 5D:
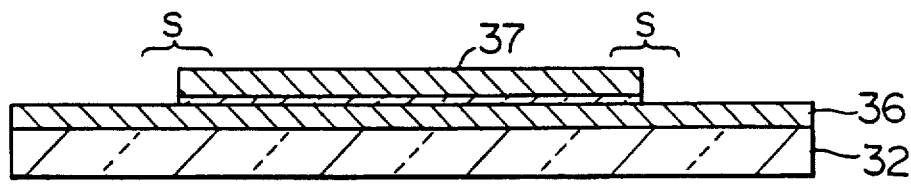

A reflection photomask shown in FIG. 5D has a first aluminum film 36 and second aluminium films 37 having large surface areas. Edge portions of the second aluminum films 37 serve as light blocking portions S due to interference between the light bundles reflected from the first and second aluminium films 36 and 37.

Figure 5E:
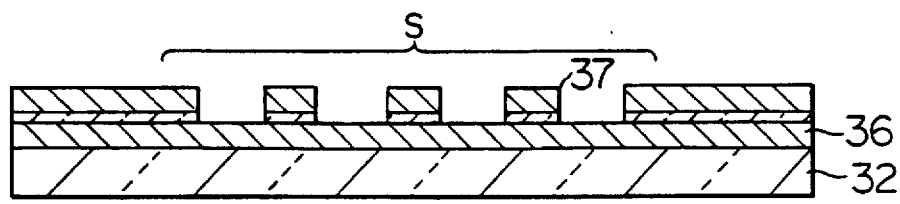

A reflection photomask shown in FIG. 5E has a first aluminium film 36 and second aluminum films 37. Some of the second aluminium films 37 are small and spaced apart from one another so that the images thereof will not be resolved. Thus, interference between the light bundles reflected from the first and second aluminium films 36 and 37 achieves large light blocking portions S.

The phase relations between the first and second films in the reflection photomasks shown in FIGS. 4A to 4C and 5A to 5E may be reversed while achieving substantially the same effects and advantages. FIGS. 7A to 7D and 8A to 8E show reflection photomasks in which the phase relations are reversed corresponding to the reflection photomasks shown in FIGS. 4A to 4D and 5A to 5E.

Figure 9:
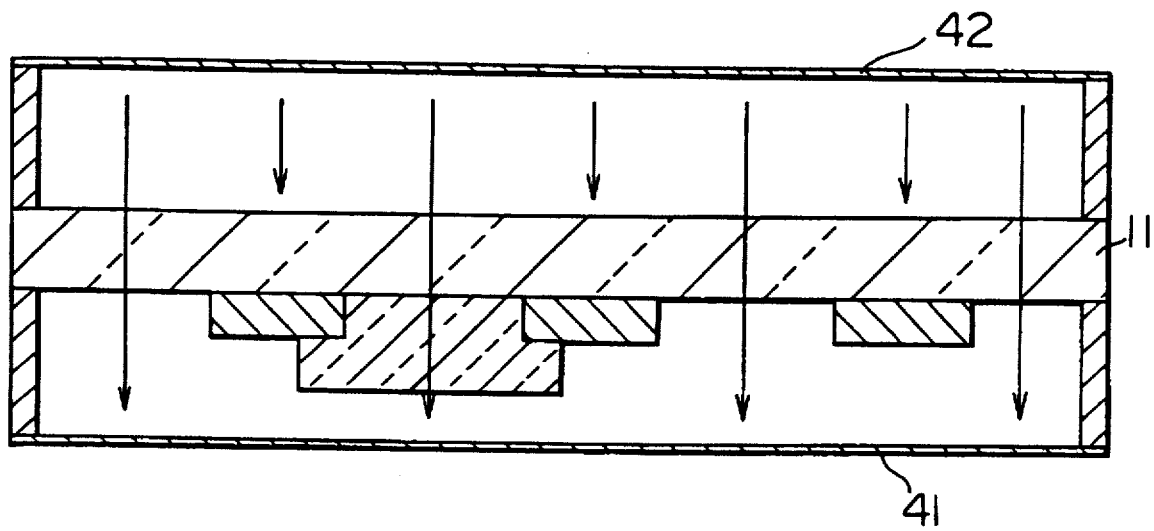
FIG. 9 is a sectional view of a conventional transmission photomask.
Figure 10:
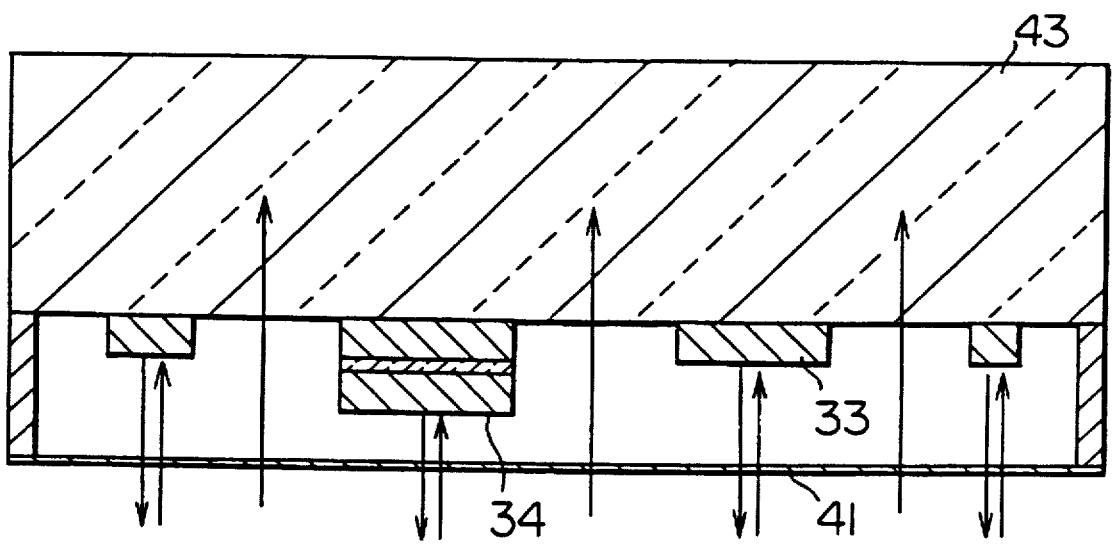
FIG. 10 is a further reflection photomask according to the present invention.
Figure 11:
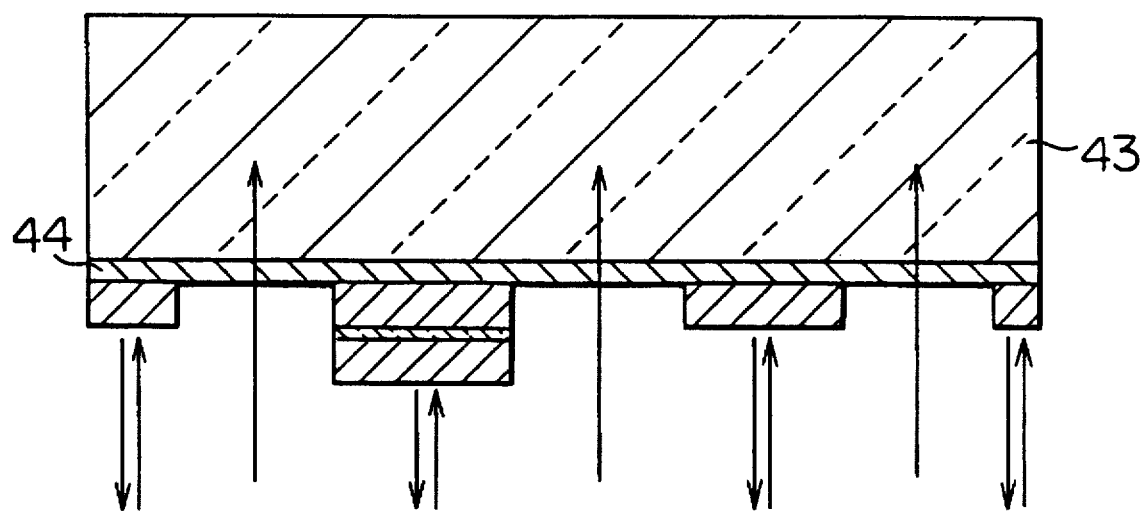
FIG. 11 is a still further reflection photomask according to the present invention.
Figure 12:
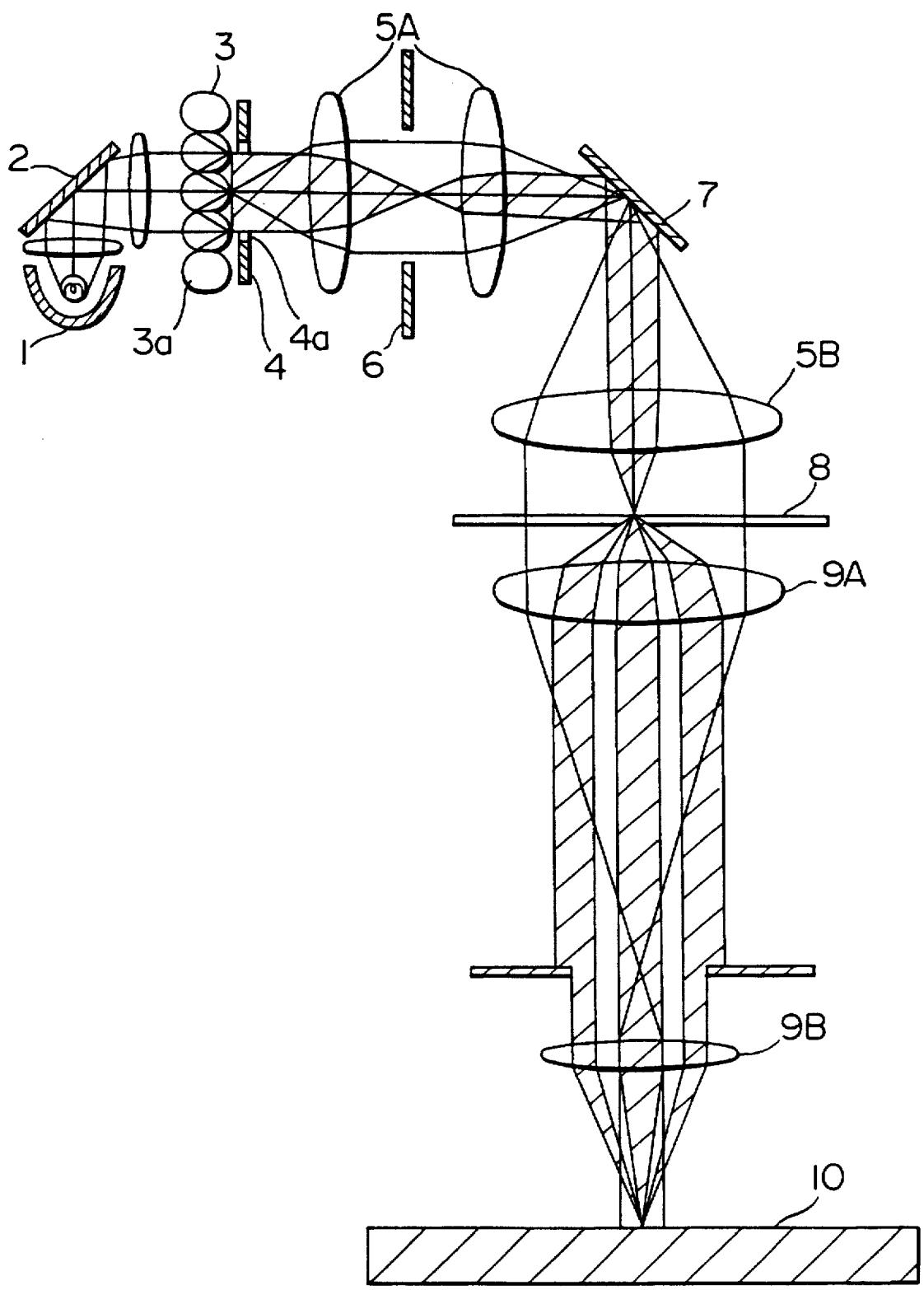
FIG. 12 illustrates a conventional optical system of an exposure apparatus.

The reflection photomask of the present invention, as shown in FIG. 10, needs only one pellicle 41 provided at the side of the photomask on which side the reflection films 33 and 34 are located, while the conventional transmission photomask needs pellicles 41 and 42 at both sides of the photomask as shown in FIG. 9.

Further, the thickness of the substrate of the reflection photomask can be selected from a wide range. As shown in FIG. 10, a thick substrate 43 can be employed. Because in a thick substrate it is relatively easy to achieve a highly precise planarity, the thick substrate 43 facilitates production of a high-precision photomask.

Still further, since the substrate of the reflection photomask of the present invention does not need to be transparent, it can be formed of various materials, such as glass, stainless steel or other metallic materials. However, low reflectivities must be achieved in exposed portions of the substrate, that is, the portions not covered with the reflection films. It is preferable to provide a reflection preventing film 44 formed of, for example, $MgF_2$, on the substrate 43, thereby enhancing the contrast between the reflecting portions and non-reflecting portions.

What is claimed is:

1. A reflection photomask comprising:

a substrate having surface; and a first light reflecting circuit pattern disposed on the surface of said substrate and having a first thickness and a second light reflecting circuit pattern disposed on the surface of said substrate and having a second thickness different from the first thickness so that light reflected from said first light reflecting circuit pattern is different in phase from light reflected from said second light reflecting circuit pattern where said first light reflecting circuit pattern includes a first light reflecting film in an isolated pattern and said second light reflecting circuit pattern is spaced apart from the isolated pattern and has such a size that an image of said second light reflecting film will not be resolved.

2. The reflection photomask claimed in claim 1 wherein said first light reflecting film and said second light reflecting film are aluminium.

3. The reflection photomask claimed in claim 1 wherein said substrate is transparent.

4. The reflection photomask claimed in claim 1 comprising a reflection preventing film on said substrate.

5. The reflection photomask claimed in claim 1 comprising a pellicle disposed opposite the surface of said substrate on which said first light reflecting circuit pattern and said second light reflecting circuit pattern are disposed.

6. A reflection photomask comprising:

a substrate having a surface; and a first light reflecting circuit pattern disposed on the surface of said substrate and having a first thickness and a second light reflecting circuit pattern disposed on the surface of said substrate and having a second thickness different from the first thickness so that light reflected from said first light reflecting circuit pattern is different in phase from light reflected from said second light reflecting circuit pattern wherein said first light reflecting circuit pattern includes a first light reflecting film in an isolated pattern and wherein said second light reflecting circuit pattern surrounds the isolated pattern and has a lower reflectivity than said first light reflecting film.

7. The reflection photomask claimed in claim 6 wherein said first light reflecting film is aluminium and wherein said second light reflecting film is chromium.

8. A reflection photomask comprising:

a substrate having a surface; and a first light reflecting circuit pattern disposed on the surface of said substrate and having a first thickness and a second light reflecting circuit pattern disposed on the surface of said substrate and having a second thickness different from the first thickness so that light reflected from said first light reflecting circuit pattern is different in phase from light reflected from said second light reflecting circuit pattern; and a third light reflecting circuit pattern located between said first light reflecting circuit pattern and said second light reflecting circuit pattern, light reflected from said third light reflecting circuit pattern having a phase intermediate the phase of light reflected from said first light reflecting circuit pattern and the phase of light reflected from said second light reflecting circuit pattern.

9. A reflection photomask comprising:

a substrate having a surface; and a first light reflecting circuit pattern disposed on the surface of said substrate and having a first thickness and a second light reflecting circuit pattern disposed on the surface of said substrate and having a second thickness different from the first thickness so that light reflected from said first light reflecting circuit pattern is different in phase from light reflected from said second light reflecting circuit pattern wherein said second light reflecting circuit pattern includes a second light reflecting film in a pattern on said first light reflecting circuit pattern so that light reflected from said second light reflecting circuit pattern has a phase substantially opposite the phase of light reflected from said first light reflecting circuit pattern whereby light reflected from said first light reflecting circuit pattern interferes with and cancels light reflected from said second light reflecting circuit pattern whereby light at a periphery of the pattern of said second light reflecting film is blocked.

10. A reflection photomask comprising:

a substrate having a surface; and a first light reelecting circuit pattern disposed on the surface of said substrate and having a first thickness and a second light reflecting circuit pattern disposed on the surface of said substrate and having a second thickness different from the first thickness so that light reflected from said first light reflecting circuit pattern is different in phase from light reflected from said second light reflecting circuit pattern wherein said second light reflecting circuit pattern includes second light reflecting films arranged on said first light reflecting circuit pattern and having a gap, the gap being so small that an image of the gap will not be resolved, and a plurality of patterns so small that images of the patterns will not be resolved whereby light reflected from said second light reflecting circuit pattern has a phase substantially opposite the phase of light reflected from said first light reflecting circuit pattern and light reflected from said first light reflecting circuit pattern interferes with and cancels light reflected from said second light reflecting circuit pattern, thereby functioning as a light blocking portion.

11. A reflection photomask comprising:

a substrate having a surface; and a first light reflecting circuit pattern disposed on the surface of said substrate and having a first thickness and a second light reflecting circuit pattern disposed on the surface of said substrate and having a second thickness different from the first thickness so that light reflected from said first light reflecting circuit pattern is different in phase from light reflected from said second light reflecting circuit pattern wherein said first light reflecting circuit pattern includes a first light reflecting film in an isolated pattern and said second light reflecting circuit pattern has a width and surrounds the isolated pattern.

* * * * *

UNITED STATES PATENT AND TRADEMARK OFFICE
CERTIFICATE OF CORRECTION

PATENT NO. : 5,538,818
DATED : July 23, 1996
INVENTOR(S) : Kamon et al.

It is certified that error appears in the above-indentified patent and that said Letters Patent is hereby corrected as shown below:

Column 7; Line 19, change "where" to --wherein--;

Column 8; Line 30, change "reelecting" to --reflection--.

Signed and Sealed this

Seventeenth Day of December, 1996

Attest:

BRUCE LEHMAN

*Attesting Officer*    Commissioner of Patents and Trademarks